(12) United States Patent
Lin et al.

(10) Patent No.: US 7,895,548 B2
(45) Date of Patent: Feb. 22, 2011

(54) FILLER CELLS FOR DESIGN OPTIMIZATION IN A PLACE-AND-ROUTE SYSTEM

(75) Inventors: Xi Wei Lin, Fremont, CA (US); Jyh-Chwen Frank Lee, Palo Alto, CA (US); Dipankar Pramanik, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 488 days.

(21) Appl. No.: 11/924,738

(22) Filed: Oct. 26, 2007

(65) Prior Publication Data
US 2009/0113368 A1 Apr. 30, 2009

(51) Int. Cl.
*G06F 17/50* (2006.01)
(52) U.S. Cl. .................. 716/55; 716/122
(58) Field of Classification Search .................. 716/10, 716/19
See application file for complete search history.

(56) References Cited

U.S. PATENT DOCUMENTS

| | | | |
|---|---|---|---|
| 6,594,809 B2 | 7/2003 | Wang et al. | |
| 7,032,194 B1 * | 4/2006 | Hsueh et al. | 716/4 |
| 7,174,532 B2 * | 2/2007 | Chlipala et al. | 716/19 |
| 7,404,174 B2 * | 7/2008 | DeMaris et al. | 716/21 |
| 7,484,198 B2 * | 1/2009 | Lin et al. | 716/10 |
| 2001/0011362 A1 * | 8/2001 | Yoshinaga | 716/8 |
| 2005/0044522 A1 * | 2/2005 | Maeda | 716/18 |
| 2005/0076320 A1 * | 4/2005 | Maeda | 716/10 |
| 2005/0216877 A1 * | 9/2005 | Pack et al. | 716/19 |
| 2006/0107243 A1 * | 5/2006 | Chlipala et al. | 716/4 |
| 2007/0130553 A1 * | 6/2007 | Wang et al. | 716/11 |
| 2007/0202663 A1 | 8/2007 | Moroz et al. | |
| 2007/0204250 A1 | 8/2007 | Moroz et al. | |
| 2008/0005712 A1 * | 1/2008 | Charlebois et al. | 716/10 |
| 2008/0265361 A1 * | 10/2008 | Krauss | 257/503 |
| 2009/0007043 A1 * | 1/2009 | Lin et al. | 716/9 |
| 2009/0055793 A1 * | 2/2009 | Melzner | 716/14 |
| 2009/0313595 A1 * | 12/2009 | Moroz et al. | 716/10 |

OTHER PUBLICATIONS

Zemke, "Numerical Analysis of Parasitic Effects in Deep Submicron Technologies", SNUG San Jose 2005, available at http://www.synopsys.com/sps/pdf/zemke_final.pdf, visited Oct. 4, 2007, 16 pp.

(Continued)

*Primary Examiner*—Stacy A Whitmore
(74) *Attorney, Agent, or Firm*—Warren S. Wolfeld; Haynes, Beffel & Wolfeld, LLP

(57) ABSTRACT

A system and method are provided for laying out an integrated circuit design into a plurality of circuit layout cells having gaps therebetween, and inserting into each given one of at least a subset of the gaps, a corresponding filler cell selected from a predefined database in dependence upon a desired effect on a performance parameter of at least one circuit cell adjacent to the given gap. The circuit layout cells may be arranged in rows, and in some embodiments the selection of an appropriate filler cell for a given gap depends upon effects desired on a performance parameter of both circuit cells adjacent to the given gap. The predefined filler cells can include, for example, dummy diffusion regions, dummy poly lines, N-well boundary shifts and etch stop layer boundary shifts. In an embodiment, circuit layout cells can be moved in order to accommodate a selected filler cell.

34 Claims, 13 Drawing Sheets

OTHER PUBLICATIONS

Loke, "Introduction to Deep Submicron CMOS Device Technology", Powerpoint presentation, May 3, 2005, available at http://www.engr.colostate.edu/EE571/Files/2005_05_03_CSU.pdf, visited Oct. 4, 2007, 40 pp.

Kanda Y., "A Graphical Representation of the Piezoresistance Coefficients in Silicon," IEEE Transactions on Electron Devices, vol. ED-29(1), 1982, pp. 64-70.

Xuemei (Jane) XI, et al., "BSIM4.3.0 Model, Enhancements and Improvements Relative to BSIM4.2.1", University of California at Berkeley (2003) available at http://www-devices.eecs.berkeley.edu/~bsim3/BSIM4/BSIM430/doc/BSIM430_Enhancement.pdf, 22 pp.

R.A. Bianchi et al., "Accurate Modeling of Trench Isolation Induced Mechanical Stress Effects on MOSFET Electrical Performance," IEEE IEDM Tech. Digest, pp. 117-120 (Dec. 2002).

Shah N., "Stress Modeling of Nanoscale MOSFET," A Thesis Presented to Graduate School of Univ. of Florida, University of Florida, 2005, 77pp.

S.E. Thompson et al., "A 90-nm Logic Technology Featuring Strained-Silicon", IEEE Transactions on Electron Devices, 2004, 8 pp.

F. Nouri et al., "A Systematic Study of Trade-offs in Engineering a Locally Strained pMOSFET", Proc. IEDM, pp. 1055-1058, 2004.

G. Eneman et al, "Layout Impact on the Performance of a Locally Strained PMOSFET," 2005 Symposium on VLSI Technology Digest of Technical Papers, pp. 22-23, 2005.

V. Moroz et al., "Analyzing strained-silicon options for stress-engineering transistors", Solid State Technology, Jul. 2004, 3pp.

C.S. Smith, "Piezoresistance Effect in Germanium and Silicon", Physical Review, vol. 94, No. 1, Apr. 1, 1954, pp. 42-49.

Smith, et al., "Exploring the Limits of Stress-Enhanced Hole Mobility", IEEE Electron Device Letters, vol. 26, No. 9, Sep. 2005, pp. 652-654.

Moroz, et al., "Options at the 45 nm node include engineered substrates", Solid State Technology, Jul. 2005, 4 pp.

Chang C.P. et al., "A Highly manufacturable Corner Rounding Solution of 0.18mm Shallow Trench Isolation," Bell Laboratories, Lucent Technologies, Murray Hill, NJ, 1997 IEEE, pp. 27.2.1 to 27.2.4.

Chen C. et al., " A Novel 0.25 mm Shallow Trench Isolation Technology," United Microelectronics Corp., Advanced Technology Develop. Dept., Hsin-Chu, Taiwan, R.O.C., 1996 IEEE, 4 pp.

Bryant A. et al., "Characteristics of CMOS device Isolation of the ULSI Age," IBM Microelectronics Div., Siemens Components Inc., 1994 IEEE, pp. 28.1.1 to 28.1.5.

International Search Report mailed Feb. 17, 2009 in PCT/US2008/071589.

* cited by examiner

MODIFY LAYOUT AND/OR SELECT AND INSERT FILLER CELLS

FILLER CELLS FOR DESIGN OPTIMIZATION IN A PLACE-AND-ROUTE SYSTEM

BACKGROUND OF THE INVENTION

Field of the Invention

The invention relates to methods and systems for improving integrated circuit performance through stress-engineering of the layout, and articles manufactured thereby.

Introduction

It has long been known that semiconductor materials such as silicon and germanium exhibit the piezoelectric effect (mechanical stress-induced changes in electrical resistance). See for example C. S. Smith, "Piezoresistance effect in germanium and silicon", Phys. Rev., vol. 94, pp. 42-49 (1954), incorporated by reference herein. The piezoelectric effect has formed the basis for certain kinds of pressure sensors and strain gauges, but only recently has it received attention in the manufacture of integrated circuits. In integrated circuit fabrication, one of the major sources of mechanical stress is the differential expansion and contraction of the different materials used. For example, typical fabrication technologies involve electrically isolating the active regions of groups of one or more transistors by surrounding them with shallow trench isolation (STI) regions which are etched into the silicon and then filled with an insulator, such as an oxide. The filling is performed at an elevated temperature. During the subsequent wafer cooling, oxides tend to shrink less than the surrounding silicon, and therefore develop a state of compressive stress laterally on the silicon regions of the device. Of significance is the stress exerted by the STI regions on the silicon forming a Metal-Oxide-Semiconductor Field-Effect Transistor (MOSFET) channel, because the piezoelectric impact of such stress can affect carrier mobility, and therefore current flow through the channel (Ion). In general, the higher the electron mobility in the channel, the faster the transistor switching speed.

The stress exerted on a region of silicon decays rapidly as a function of distance from the stress-causing interfaces. In the past, therefore, while process technologies could not produce today's extremely narrow channel widths, the stress-induced impact on performance could be ignored because only the edges of the diffusion region (adjacent to the STI regions) were affected. The channel regions were too far away from the STI regions to exhibit any significant effect. As process technologies have continued to shrink, however, the piezoelectric effect on transistor performance is no longer negligible.

Methods have been developed to model the impact of stress on the behavior of integrated circuit devices at the level of individual transistors. These methods include, for example, full-scale analysis with a Technology Computer Aided Design (TCAD) system; and a method known as the "Length-of-Diffusion" (LOD) method described in R. A. Bianchi et al., "Accurate Modeling of Trench Isolation Induced Mechanical Stress Effects on MOSFET Electrical Performance," IEEE IEDM Tech. Digest, pp. 117 120 (December 2002), in U.S. Patent Publication No. 2002/0173588 (2003), and in Xuemei (Jane) Xi, et al., "BSIM4.3.0 Model, Enhancements and Improvements Relative to BSIM4.2.1", University of California at Berkeley (2003), available at http://www device-.eecs.berkeley.edu/, all incorporated herein by reference.

Behaviors characterized by the various methods for analyzing stress impact at the level of individual transistors can be used to derive circuit level parameters (e.g. SPICE parameters) of the device for subsequent analysis of the circuit at macroscopic levels. Such analysis can help predict whether the circuit will operate as intended, and with what margins, or whether the design or layout needs to be revised. If revision is necessary, it typically involves applying certain general rules-of-thumb, such as increasing the size of any transistor that, according to the stress analysis, turns out to be weaker than expected. But increasing the transistor size can degrade other performance measures, such as power consumption, so a compromise becomes necessary. In addition, the impact of stress on transistor performance is layout sensitive. Since typical irregularities in an integrated circuit layout result in different amount of impact on the performance of different transistors across the layout, these kinds of compromises typically must be made manually on a transistor-by-transistor basis. Still further, if automated place-and-route software is then used to re-layout the revised circuit design, the revised layout will differ from the original and show different stress effects than the original, often completely upsetting the circuit modifications that were made to accommodate the stress impact of the original layout.

BRIEF SUMMARY OF THE INVENTION

The invention described herein addresses methods and systems for improving integrated circuit layouts and fabrication processes in order to better account for stress effects and other effects that affect circuit performance. In one aspect of the invention, a system and method are provided for laying out an integrated circuit design into a plurality of circuit layout cells having gaps therebetween, and inserting into each given one of at least a subset of the gaps, a corresponding filler cell selected from a predefined database in dependence upon a desired effect on a performance parameter of at least one circuit cell adjacent to the given gap. The circuit layout cells may be arranged in rows, and in some embodiments the selection of an appropriate filler cell for a given gap depends upon effects desired on a performance parameter of both circuit cells adjacent to the given gap. The predefined filler cells can include, for example, dummy diffusion regions, dummy poly lines, N-well boundary shifts, and etch stop layer boundary shifts. In an embodiment, circuit layout cells can be moved in order to accommodate a selected filler cell.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Compressive stress exerted on transistor channel regions enhances performance in certain kinds of situations, and degrades transistor performance in other kinds of situations. For example, compressive stress exerted longitudinally or transversely on the channel of an N-channel transistor, whose current flow is along <110> direction on a wafer surface in (100) plane of silicon single crystal, can degrade certain performance parameters of the transistor. Specifically, electron and hole mobility, and therefore Ion and transistor switching speed, often can degrade by as much as 20-30%/GPa. Layout enhancements that reduce or relieve compressive stress in the channels of N-channel transistors, therefore, are very likely to enhance the performance of these transistors. As another example, compressive stress exerted transversely across the channel of a P-channel transistor often can degrade hole mobility, and therefore Ion and transistor switching speed, by as much as 70%/GPa. On the other hand, compressive stress exerted longitudinally on the channel of a P-channel transistor often can enhance hole mobility, and therefore Ion and transistor switching speed, by as much as 90%/GPa. Layout enhancements that reduce or relieve transverse compressive stress in the channels of P-channel transistors, and layout enhancements that increase longitudinal compressive stress in the channels of P-channel transistors, therefore, are all very likely to enhance the performance of these transistors.

Figure 1:
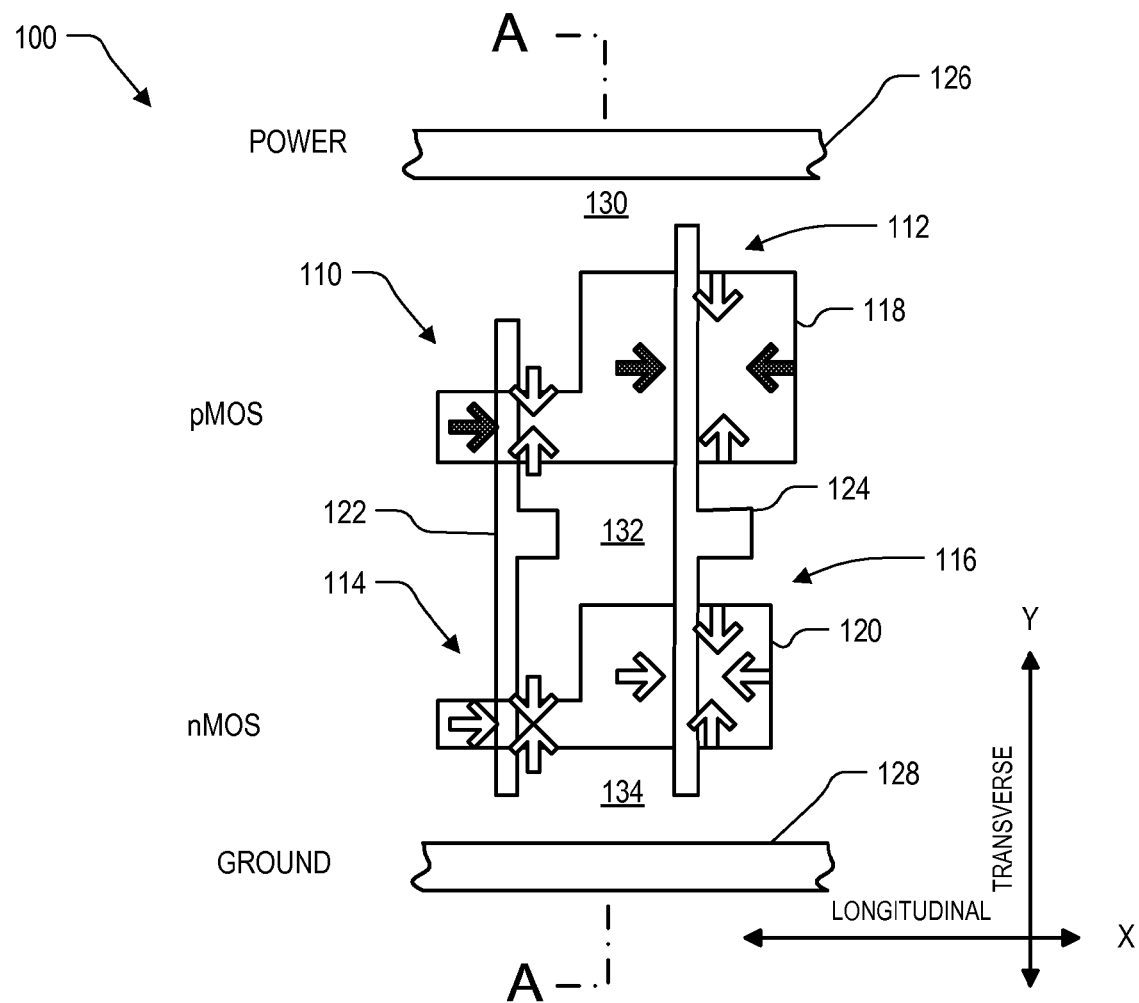
FIG. 1 illustrates a plan view of a typical layout region of an integrated circuit design.
Figure 1A:
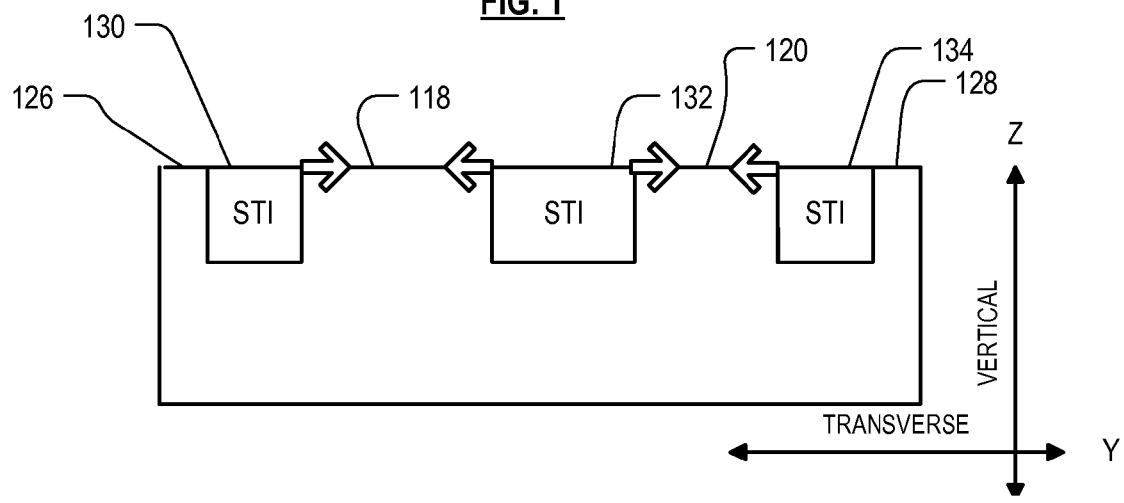
FIG. 1A illustrates a cross-section of a chip taken at sight-line A-A as shown in FIG. 1.

FIG. 1 illustrates a plan view of a typical layout region 100 of an integrated circuit design. FIG. 1A illustrates a cross-section of the resulting chip taken at sight-line A-A as shown in FIG. 1. Shown in FIG. 1 are two P-channel transistors 110 and 112, and two N-channel transistors 114 and 116. The two P-channel transistors share a diffusion region 118, and the two N-channel transistors share a different diffusion region 120. Each transistor has a channel which is defined by its diffusion region and a gate conductor which crosses the diffusion region. The drain and source regions of each of the transistors are the portions of the diffusion regions on opposite sides of the gate conductor, but whether one constitutes the source and the other the drain or vice-versa, depends on the circuit being implemented.

In typical CMOS fashion, to form a logical inverter element, the gate conductor crosses both a P-diffusion and an N-diffusion to define both a P-channel and an N-channel transistor. Thus in FIG. 1 a gate conductor 122 crosses both diffusion regions to define both transistors 110 and 114, and a gate conductor 124 crosses both diffusion regions to define both transistors 112 and 116. The channels of the transistors in a typical fabrication process are slightly different (from left-to-right in the figure) than the gate conductors themselves because of the addition of other components of the gate stack (not shown) such as spacers, and lateral diffusion of the source and drain dopants under the gate. As used herein, the term "region" represents a two-dimensional area in a plan view of the layout. Stress "in" a region is considered to be the stress close to the surface of the region, where current flows. In the embodiments described herein, an approximation is made that the stress "in" a region is equal to the stress "at" the surface of the region. In another embodiment, stresses within a volume of the chip can be taken into account as well, including at depths below the surface.

As used herein and as shown in FIG. 1, the "longitudinal" direction of a transistor is the direction of current flow between source and drain when the transistor is turned on. The "transverse" direction is perpendicular to the longitudinal direction, and perpendicular to the direction of current flow. Both the longitudinal and transverse directions of the transistor are considered to be "lateral" directions, meaning a direction that is parallel to the surface. Other "lateral" directions include those (not shown) which are parallel to the surface but intersect both the transverse and longitudinal directions at angles. The "vertical" direction is normal to the surface of the channel and therefore perpendicular to all possible lateral directions. The "length" of a structure in the layout is its length in the longitudinal direction, and its "width" is its width in the transverse direction. It can be seen from the layout of FIG. 1 that the channel lengths are significantly shorter than their widths, which is typical for the transistors that are used in logic circuits. Also shown in FIGS. 1 and 1A are X, Y and Z coordinate axes of the layout. Primarily for lithographic reasons, it is common in logic circuit design that all transistors be oriented alike, and consistent with this convention, in the layout of FIG. 1, all four transistors are oriented such that the longitudinal direction of the transistors are in the X direction of the layout, and the transverse direction of the transistors are in the Y direction of the layout. The Z direction, visible in FIG. 1A, is perpendicular to both the X and Y directions, representing a depth into the integrated circuit chip.

Additionally, the term "region", as used herein, does not necessarily imply a physical boundary. That is, one "region" can contain multiple "sub-regions", which themselves are considered herein to be "regions" as well. Thus it is reasonable to refer to a region within a diffusion region, even one that has not been defined physically in any way. In FIG. 1A, more than one set of source and drain diffusions share a single overall diffusion region. In yet another embodiment, the source, drain and channel regions collectively are laterally co-extensive with the overall diffusion region. Also, in another embodiment, the source and drain diffusion regions might be made of different materials (e.g. SiGe) than the channel region (e.g. Si). In all of these cases it can be said that the source diffusion region forms "at least part of" a diffusion region, that the drain diffusion region forms "at least part of" a diffusion region, and that a channel region can exist even before it is defined physically.

FIG. 1 also illustrates power and ground diffusion buses 126 and 128, respectively. Typically metal rails overlay these diffusion buses, and since the present discussion is concerned primarily with plan views of layout features, it makes little difference whether what is referred to is the diffusion bus or the metal rail. For convenience, therefore, both buses and rails are referred to herein simply as "conductors".

As can be seen from FIG. 1, the transistors and their diffusions are disposed laterally in a row between the power and ground conductors. The power and ground conductors, as well as power supply conductors of any other voltage, are all sometimes referred to herein collectively as "power supply conductors".

Figure 2:
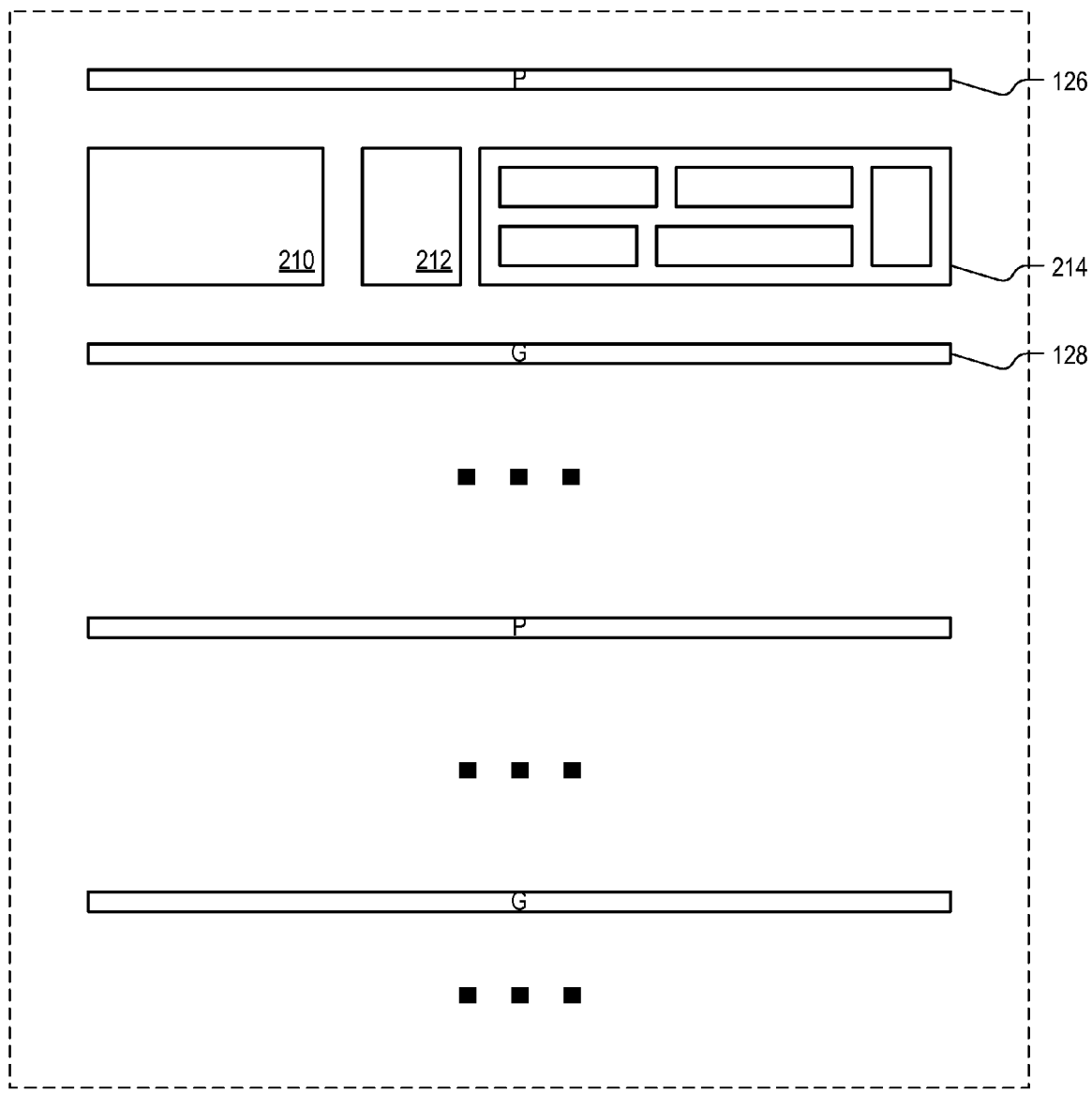
FIG. 2 illustrates a larger region of the layout of FIG. 1.

FIG. 2 illustrates a much larger region of the layout of FIG. 1. As shown in FIG. 2, this layout includes power supply rails (conductors) that extend across most or all of the chip in the X dimension. Such an arrangement is common, especially but not exclusively for ASICs, standard cells and FPGAs. The power supply conductors 126 and 128 (FIG. 1) are shown also in FIG. 2. In typical 2-voltage circuits (power and ground), the rails alternate power and ground in the Y dimension. The transistors of the logic circuitry are laid out in a row between a pair of the rails, usually within individual cells or macrocells such as 210, 212 and 214 in FIG. 2. Typically the cells are all of the same size in the Y dimension but may vary in size in the X dimension. Cell 212, for example, contains the four transistors with two diffusion regions as shown in FIG. 1. Cell 214 in FIG. 2 represents diffusion regions as the smaller rectangles, and the regions between the rails and outside of the diffusion regions are STI regions containing oxide. All these STI regions conventionally exert compressive stress on the diffusion regions, including within the transistor channels, both longitudinally and transversely. Tensile STI is also possible, which has opposite effects to a device than does compressive STI.

Returning to FIG. 1, arrows have been inserted to illustrates various components of the STI-induced compressive stress exerted on the four channel regions. It can be seen that stress is exerted both longitudinally and transversely. Some of the transverse stress components are also shown in FIG. 1A. As mentioned above, all such compressive stress components tend to degrade performance of the transistors except for longitudinal stresses on P-channel transistors 110 and 112, which tend to enhance performance. The performance enhancing stress components are indicated in FIG. 1 by darkened arrows. In particular, it is noteworthy that all transverse stress components are detrimental.

Figure 3:
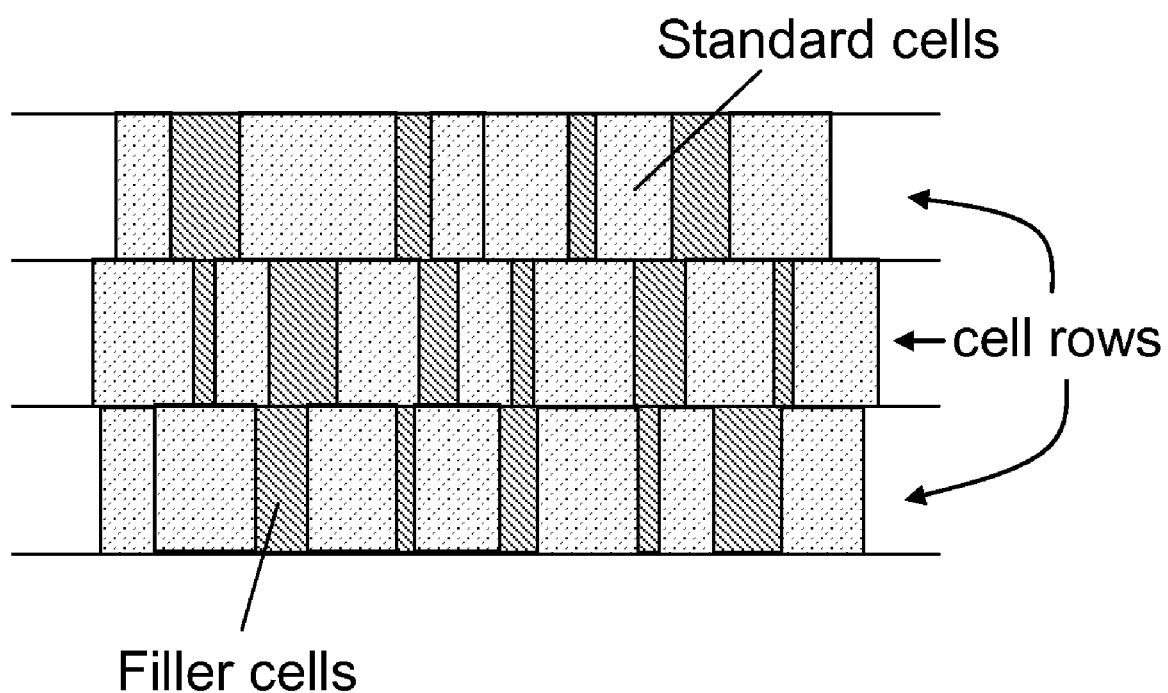
FIG. 3 is another view of a layout like that of FIG. 2.

FIG. 3 is another view of a layout like that of FIG. 2. In FIG. 3 it can be seen that the cells are typically arranged in rows, and gaps commonly exist in the layout after initial cell placement. The cells shown in FIG. 3 are sometimes referred to herein as "circuit layout cells", since they derive from the circuit design. Most transistors in the cells are typically oriented so that their longitudinal direction is lengthwise along the row (horizontally in the illustration of FIG. 3. It can be seen from the figure that the gaps between circuit layout cells lie in the same rows as the cells, and each (except perhaps for a gap at the end of a row) has a pair of circuit layout cells adjacent to it in the same row. As used herein, the term "adjacent" means "next to". Two "adjacent" items may or may not be in contact with each other, but there is no item of the same kind in between. For example, "adjacency" of two particular cells implies that there is no third cell between them, although the two particular cells may themselves be separated by a gap. Two items of different kinds (such as a cell and a gap) are considered herein to be "adjacent" to one another if there are no other items of either kind between them.

The gaps have the same height as the other cells in the row, but have varying widths. The gap widths are determined by the place-and-route system as it optimizes the positions along the row of the circuit cells. A number of considerations are taken into account conventionally in optimizing such cell placement, such as, for example, circuit density maximization, congestion resolution, timing considerations (such as minimizing delays, or equalizing delays among two or more signal paths), and considerations of power distribution. The place-and-route system develops a cost function which quantizes each of the factors it will consider, and combines them in a fashion which weights them according to a predefined set of priorities. The place-and-route system then searches iteratively for an arrangement of circuit cells that minimizes the cost function.

After the circuit cells have been placed in the layout rows, a typical system adds filler cells in the gaps in order to maintain continuity in power/ground and in transistor wells. The inside of these filler cells can be nearly empty, or sometimes they contain dummy or active features for design optimization. The filler cell contents are not, in a conventional layout, dependent on the content of any adjacent circuit cells.

System Flow

Figure 4:
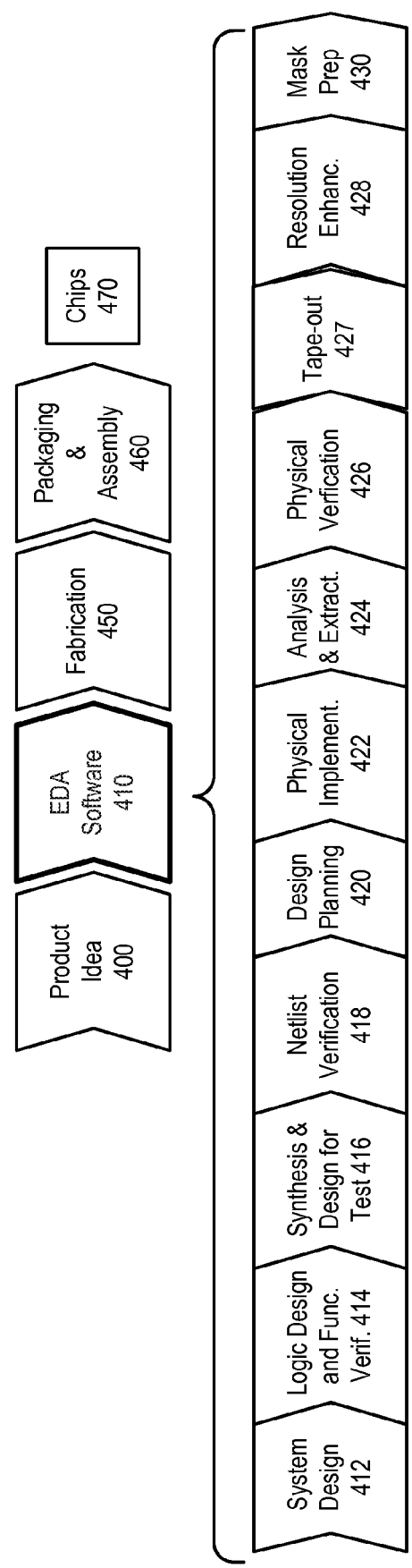
FIG. 4 shows a simplified representation of an illustrative digital integrated circuit design flow.

FIG. 4 shows a simplified representation of an illustrative digital integrated circuit design flow. At a high level, the process starts with the product idea (step 400) and is realized in an EDA (Electronic Design Automation) software design process (step 410). When the design is finalized, the fabrication process (step 450) and packaging and assembly processes (step 460) occur resulting, ultimately, in finished integrated circuit chips (result 470).

The EDA software design process (step 410) is actually composed of a number of steps 412-430, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 410) will now be provided.

System design (step 412): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 414): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 416): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 418): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 420): Here, an overall floor plan for the chip is constructed and analyzed for timing and top-level routing. Example EDA software products from Synopsys, Inc. that can be used at this step include Astro and IC Compiler products.

Physical implementation (step 422): The placement (positioning of circuit elements) and routing (connection of the same) occurs at this step. Example EDA software products from Synopsys, Inc. that can be used at this step include the Astro and IC Compiler products. Certain aspects of the invention herein can take place during this step, or just afterwards.

Analysis and extraction (step 424): At this step, the circuit function is verified at a transistor level, this in turn permits what-if refinement. Example EDA software products from Synopsys, Inc. that can be used at this step include AstroRail, PrimeRail, Primetime, and Star RC/XT products. Certain aspects of the invention can take place during this step as well.

Physical verification (step 426): At this step various checking functions are performed to ensure correctness for: manufacturing, electrical issues, lithographic issues, and circuitry. Example EDA software products from Synopsys, Inc. that can be used at this step include the Hercules product.

Tape-out (step 427): This step provides the "tape-out" data for production of masks for lithographic use to produce finished chips. Example EDA software products from Synopsys, Inc. that can be used at this step include the CATS(R) family of products.

Resolution enhancement (step 428): This step involves geometric manipulations of the layout to improve manufacturability of the design. Example EDA software products from Synopsys, Inc. that can be used at this step include Proteus, ProteusAF, and PSMGen products.

Mask preparation (step 430): This step includes writing of the masks themselves.

Figure 5:
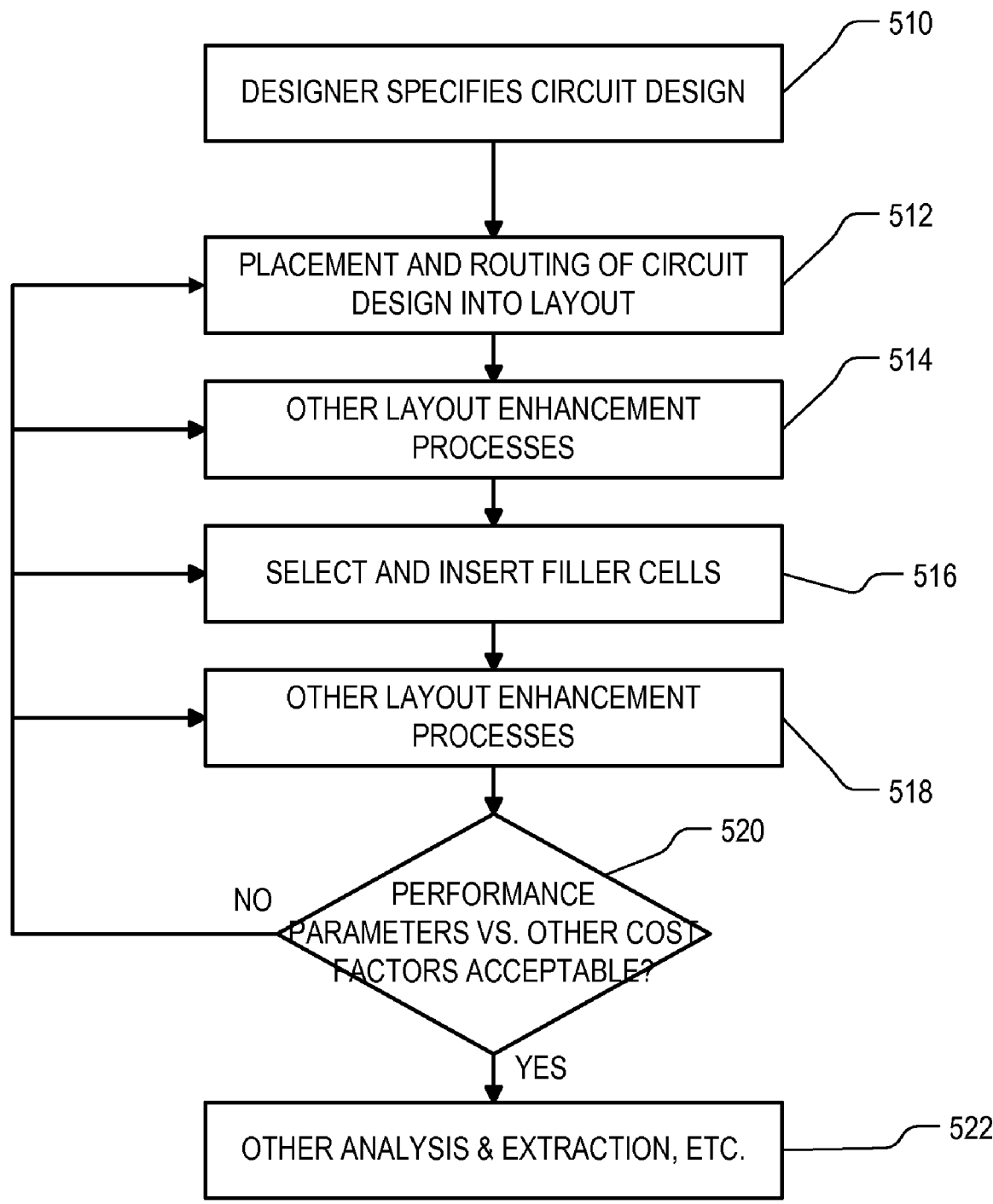
FIGS. 5, 10, 11 and 12 collectively form a flowchart illustrating portions of steps in FIG. 4 involved in implementing aspects of the invention.

FIG. 5 is a flowchart illustrating portions of steps 422 and 424 (FIG. 4) involved in implementing aspects of the invention. As with all flowcharts herein, it will be appreciated that many of the steps in FIG. 5 can be combined, performed in parallel or performed in a different sequence without affecting the functions achieved. In step 510, corresponding roughly to steps 400 and 412-420 in FIG. 4, the designer specifies a circuit design. As used herein, an "integrated circuit design" is a transistor level design, after synthesis from VHDL and before layout. A designer can "specify" an integrated circuit design either by specifying it at the transistor level, or by specifying at a higher level and manually or automatically converting it to the transistor level through one or more sub-steps.

In step 512, the circuit design undergoes "placement", and optionally "routing" as well, thereby resulting in a "layout". Step 512 corresponds roughly to part of step 422 (FIG. 4). As used herein, a "layout" defines a set of masks that, when applied in a fabrication process, together define the physical features of the integrated circuit device. Among other things, these features can include transistor source, drain and channel regions, and diffusion regions, and STI regions, and so on, and together these features define circuit structures such as the transistors specified in the integrated circuit design. The masks defined by a "layout", as that term is used herein, may (and typically do) go through one or more post-processing steps such as steps 426-430 (FIG. 4) before they are finalized for production. Although a layout typically defines masks for all of the fabrication process steps, it will be appreciated that for some aspects of the present invention the integrated circuit design need only be compiled to the point of a layout that defines fewer than all such masks. For example, for some aspects the layout need not yet define masks for the so-called "back-end" fabrication steps, such as the formation of routing and via layers.

In step 514, various processes, both known and to-be-developed, can be employed to enhance the layout. These processes are not themselves important to the invention.

In step 516, predefined specialized filler cells are selected and inserted into the gaps between cells. These filler cells are pre-defined for adjusting a performance parameter of an adjacent circuit cell, not the conventional filler cells intended only to maintain continuity in power/ground and in transistor wells. In one embodiment, filler cells are selected and inserted in all the gaps in the layout. While this may include quite a few gaps, the process can be greatly facilitated by selecting the filler cells from a predefined table that is indexed by certain layout characteristics of the cells on either or both sides of the gap. In another embodiment, only the gaps on both sides of selected cells receive filler cells. For example, the selected cells might include only the cells in a critical signal path. The list of cells in a critical signal path is usually already known from the place-and-route system, or from a well-known analysis of the preliminary layout.

Also, in one embodiment sometimes referred to herein as a "passive" embodiment, the selected gaps are filled with filler cells without changing the position of any of the circuit cells in the layout. In another embodiment, sometimes referred to herein as an "active" embodiment, certain cells can be moved in order either to increase the width of a gap in order to accommodate a wider predefined filler cell, or decrease the width of a gap in order to permit a narrower predefined filler cell to contact (and thereby appropriately affect) the circuit cells on both sides of the filler cell. If a cell is moved to accommodate a wider predefined filler cell, usually it will be shifted over within the same row. Some embodiments, however, also allow a circuit cell to be jumped to a different (usually adjacent) row. These embodiments are sometimes referred to herein as "active" embodiments.

If a circuit cell is moved, it is preferred that the arrangement of circuit cells before and after the move be "topologically equivalent". As used herein, two arrangements of layout circuit cells are considered to be "topologically equivalent" if one arrangement can be deformed into the other without cutting any of the interconnects or re-routing them (or any part of them) into a different layer. Stretching, moving, re-orienting, and re-routing of interconnects other than by moving parts of them into a different layer, do not negative topological equivalence. Note that two arrangements which violate the rules of topological equivalence can still, in fact, be topologically equivalent since it is the ability to deform one into the other without violating the rules that matters. For example, if one were to re-route an interconnect in a way that requires it to change layers, when layer-changing could have been avoided, then the layer-changing re-route does not itself negative topological equivalence. Topological equivalence is lost only when a rule violation cannot be avoided.

In step 518, still other layout enhancement processes can be performed. Again, these processes can be either presently known or yet to be developed, and are not themselves important to the invention.

In step 520 it is determined whether the performance parameters of the circuit cells addressed by the filler cells and other layout enhancements are acceptable. Also, if circuit cells were moved in step 516, then it will be appreciated that some of the optimization previously performed by the place-and-route system in step 512 may have been degraded. In this case, in step 520 it is determined whether the resulting trade-off between the improvement of circuit cell performance parameters and the degradation of other cost factors that were considered by the place-and-route system, is acceptable. If so, then the user can proceed to subsequent steps of the EDA process such as analysis and extraction step 424, and so forth (step 522). As used herein, a layout revised for stress effects is sometimes referred to herein as having been formed "in dependence upon" the automatically-generated layout from step 512. As used herein, a given layout is formed "in dependence upon" a predecessor layout if the predecessor layout influenced the given layout. If there is an intervening step or time period, or if there are other steps performed between the step 512 layout and the given layout, the given layout can still be "in dependence upon" the predecessor layout. If the intervening step combines more than one layout, the given layout is considered to have been formed "in dependence upon" each of the predecessor layouts.

The circuit cell performance parameters referred to in step 520 are any parameters of the cell that can then be used in simulations of higher level functions. For example, if a circuit cell contains a CMOS inverter, performance parameters such as power dissipation, switching speed, drive strength and input capacitance might be used. If the circuit cell contains a single transistor, then performance parameters such as SPICE parameters can be used. Such SPICE parameters can include electron mobility, Ion, and transistor switching speed. In an embodiment, the performance parameters referred to in step 520 may be higher level parameters, encompassing the functioning of more than one of the circuit cells. For example, the total time delay in a signal path may be used as the performance parameter evaluated in step 520. Note that as used herein, a "parameter" is considered merely a slot or container. It is not itself a value. However, in a particular circuit or structure, a parameter can have a value. The present discussion refers to such a value as the "value" of the particular parameter.

Types of Filler Cells

Before discussing the step 516 of selecting and inserting filler cells in more detail, it will be useful to discuss the types of predefined filler cell designs made available herein, and the effects they have on adjacent circuit cells. In the embodiments described herein, a filler cell includes up to five types of structures which can affect adjacent circuit cells: diffusion regions, polysilicon lines, contacts, well boundary shifts, and etch stop layer boundary shifts. All are dummy structures, meaning they do not connect electrically to the circuit.

Figure 6:
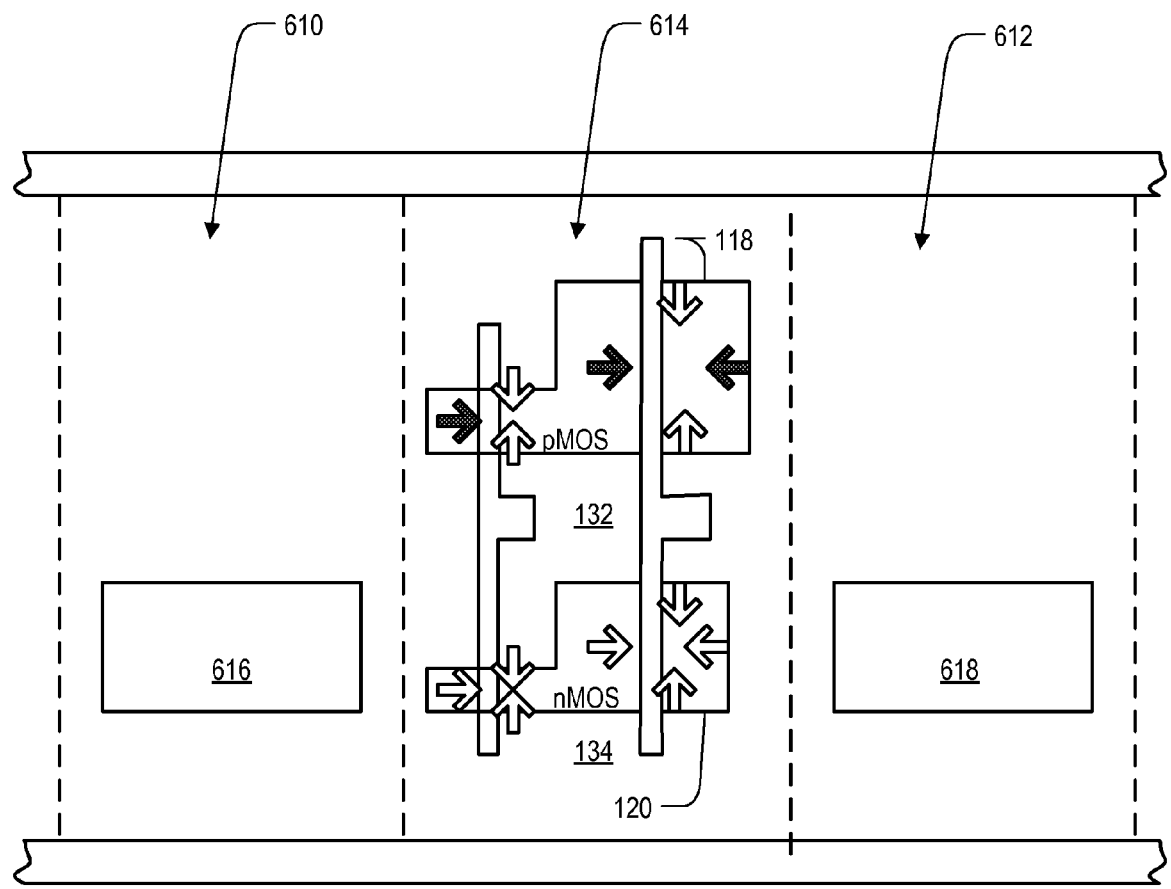
FIGS. 6, 7, 8 and 9 illustrate sample filler cell designs on opposite sides of a subject circuit layout cell like that of FIG. 1.

A diffusion region in a filler cell tends to reduce compressive stress exerted longitudinally (along the length of the row) on the adjacent circuit cells. Since transistors in circuit cells are usually oriented with their longitudinal direction aligned with the length of the row, such a diffusion region will tend to reduce longitudinal compressive stress exerted on transistor channels in the adjacent circuit cells. As a result, such a diffusion region tends to degrade the switching speeds and Ion of nearby P-channel transistors and tends to increase the switching speeds and Ion of nearby N-channel transistors. Therefore, if it is desired to maximize switching speeds and Ion's, then a filler cell having a diffusion region placed longitudinally to nearby N-channel transistors, and having no diffusion region disposed longitudinally to nearby P-channel transistors, might be a good choice. Such an arrangement can be seen in FIG. 6, in which filler cells 610 and 612 on both sides the cell 614 from FIG. 1, contain diffusion regions 616 and 618, respectively, disposed longitudinally to diffusion region 120 of the N-channel transistors in the circuit cell 614, and no diffusions disposed longitudinally to the diffusion 118 of the P-channel transistors in the circuit cell 614.

Sometimes it is desirable to reduce switching speeds and Ion's, rather than increase them, such as in a signal path that must have at least a particular delay in order to meet hold time requirements of a destination device. In this case filler cells 610 and 612 might be chosen which contain diffusion regions disposed longitudinally to diffusion region 118 of the P-channel transistors in the circuit cell 614, and no diffusions disposed longitudinally to the diffusion 120 of the N-channel transistors in the circuit cell 614.

It will be appreciated that the closer the nearest diffusion region boundary is to the nearest transistor in an adjacent circuit cell, the greater the effect will be. Therefore, the variety of filler cell designs made available in the present embodiment includes two or three designs that have their diffusion region boundaries at different distances from the edge of the filler cell. In addition, in the "passive" embodiment described above, either the filler cell must fill an entire gap or more than one filler cell must be inserted to fill the entire gap. A variety of different filler cell design widths are therefore made available for use as needed.

Still further, it is often important to control the effect that an inserted filler cell has on the circuit cell on the opposite side of the gap. This is important especially if the latter circuit cell is part of a critical signal path. Two different strategies can be used to take these needs into account. In one embodiment, the available filler cell designs include varieties having only half the width of the gap; a filler cell design appropriate to the needs of the left-adjacent circuit cell is inserted on the left side of the gap, and a filler cell design appropriate to the needs of the right-adjacent circuit cell is inserted on the right side of the gap. In another embodiment, the available filler cell designs include varieties which have a first desired effect on the left-adjacent circuit cell and a second desired effect on the right-adjacent circuit cell.

The shape and proximity of dummy diffusion regions in a filler cell affects the performance parameters of an adjacent circuit cell by reason of at least two different mechanisms. Stress reduction in transistor channels in the circuit cell is one mechanism, previously discussed. But the shape and proximity of the dummy diffusion region can also affect performance of an adjacent circuit cell by reason of optical proximity effects. Usually optical proximity effects are considered undesirable, and something to be corrected. But herein they also may be used to advantage, by selecting filler cell designs which have a desired effect on the shape or size of diffusion regions in the adjacent circuit cell.

A second type of structure which can be included in filler cell designs to affect adjacent circuit cells, primarily in a fabrication process that includes a contact etch stop layer (CESL) above the gate stack layers, is dummy polysilicon lines. Commonly, after formation of the gate stacks in a fabrication process, a contact etch stop layer (CESL), also called a cap layer, is applied over the wafer. This layer is frequently a nitride material, and is commonly available in pre-strained formulations with various compressive stresses of up to −2.5 GPa, and with various tensile stresses of up to +1.5 GPa. These residual strains couple into the transistor channel regions and can enhance or degrade transistor performance. In some fabrication processes, a tensile strained cap layer is deposited on the wafer, then etched away over the P-channel transistors. In other fabrication processes, a compressively strained cap layer is deposited on the wafer, then etched away over the N-channel transistors. In yet a third type of fabrication processes, a layer of one material type is applied first, etched away over one type of transistors, then a layer of the second material type is applied and etched away over the second type of transistors. The latter process is often referred to as DSL (dual stress liner). In all three types of processes, the interface between the two materials is typically half-way between the N-channel and P-channel diffusions, roughly coincident with the edges of the N-well and P-well implants. The resulting cap layer thus is tensile over the N-channel transistors, or compressive over the P-channel transistors, or both. Compressive longitudinal stress coupled into transistor channel regions from strained cap layer materials can improve performance of P-channel transistors, and tensile longitudinal stress coupled into transistor channel regions can improve performance of N-channel transistors.

The depth in a transistor channel at which stress has the greatest performance impact is at or just below the surface of the wafer, well below the cap layer. Therefore, the amount of stress experienced in a transistor channel can be controlled or fine-tuned by upsetting in a controlled manner the coupling of stress from the cap layer into the wafer surface. Since the cap layer rises up over any polysilicon structures placed on the wafer, such coupling can be affected through the use of dummy polysilicon lines, transversely oriented, nearby in adjacent filler cells.

Figure 7:
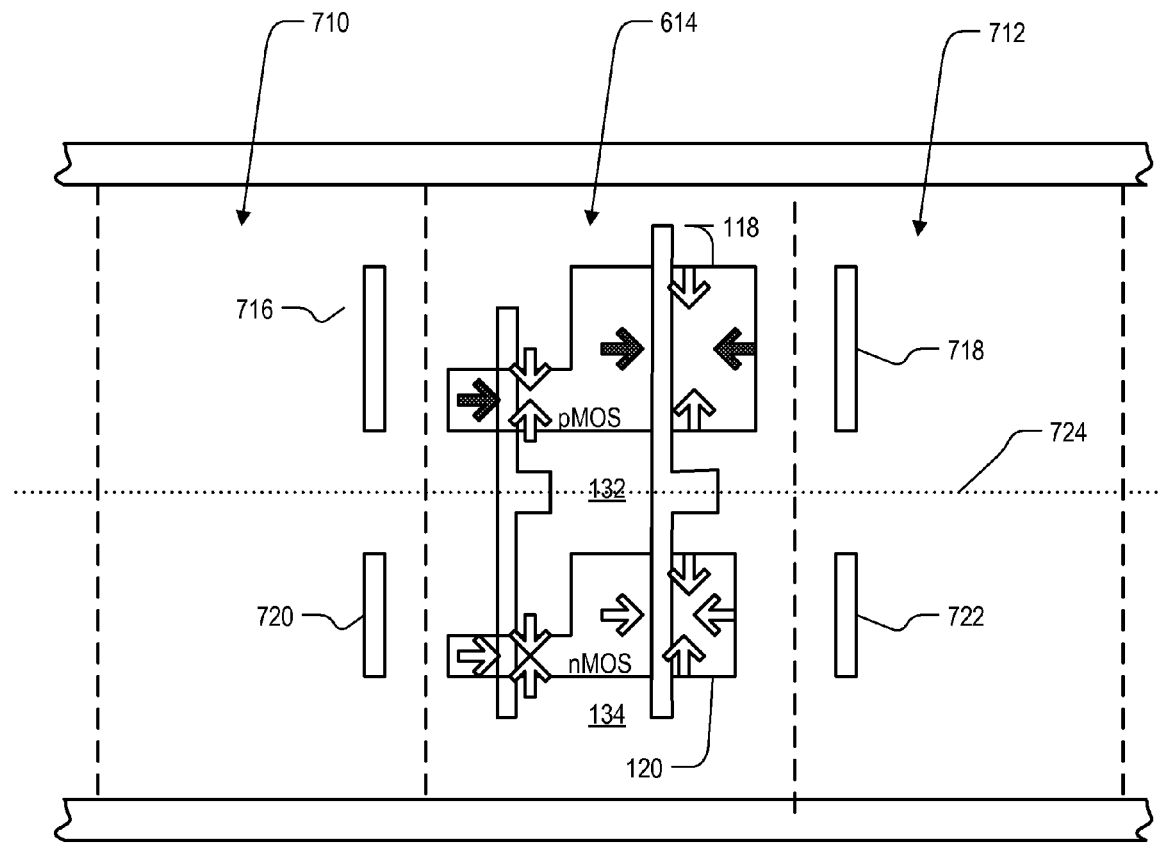

FIG. 7 illustrates two filler cells 710 and 712 on opposite sides of the cell 614 from FIG. 1. These filler cells contain transversely-oriented polysilicon lines close to the circuit cell 614, to thereby reduce the coupling of stress (compressive or tensile) from the contact etch stop layer into the transistor channel regions in the circuit cell 614. Poly lines 716 and 718 are disposed on longitudinally-opposite sides of the P-channel diffusion in the circuit cell 614, and poly lines 720 and 722 are disposed on longitudinally-opposite sides of the N-channel diffusion in the circuit cell 614. The embodiment of FIG. 7 uses a dual stress liner, with the two cap layer materials meeting at a dividing line illustrated symbolically as dotted line 724 in FIG. 7. The compressive material is disposed over the P-channel transistors (upper half of the row in the drawing) and the tensile material is disposed over the N-channel transistors (lower half of the row in the drawing). Accordingly, all the poly lines 716, 718, 720 and 722 shown in the embodiment of FIG. 7 tend to reduce coupling of longitudinal stress into the transistor channel regions in the circuit cell 614, thereby tending to reduce their transistor switching speeds and Ion's. It will be appreciated that similarly to the diffusion structures described above, a variety of different filler cell designs can be made available for use in either increasing or decreasing circuit cell performance parameters, with poly lines either present or absent in the upper or lower half of the row, and if present, at different distances from the edge of the filler cell. Other variations described above for diffusion structures can also be made available for filler cell designs having poly structures.

Like dummy diffusion regions, the shape and proximity of polysilicon lines in a filler cell affects the performance parameters of an adjacent circuit cell not only by reason of stress reduction in transistor channels, but also as a result of optical proximity effects. The optical proximity effects can be much more significant for dummy poly structures than for dummy diffusion regions because of the effect they can have on the shape and length (in the longitudinal dimension) of transistor gate structures in the adjacent circuit cells. Many transistor performance parameters are highly sensitive to the gate shape and length. The selection of filler cell designs using dummy poly lines should take optical proximity effects into account, as well as stress effects.

A third type of structure which can be included in filler cell designs to affect adjacent circuit cells, again primarily in a fabrication process that includes a contact etch stop layer above the gate stack layers, is dummy contacts. Dummy contacts can relieve stress on nearby transistor channel regions in much the same way as can polysilicon lines. The effects are typically smaller, however, because the dimensions of dummy contacts are typically smaller. The optical proximity-based effects are even smaller, again due to the very small dimensions of dummy contacts. Nevertheless, filler cell designs having various numbers and placements of dummy contacts can be made available, for example for very fine tuning of performance parameters of adjacent circuit cells. Many of the same considerations discussed above for selecting filler cell designs having dummy poly structures, also apply for selecting filler cell designs having dummy contacts.

Yet a fourth type of structure which can be included in filler cell designs to affect adjacent circuit cells, is a well boundary shift. In a typical CMOS device, the N-channel transistors are formed either directly in a P-type substrate or in a P-type well ("P-well") which is itself formed in the substrate, and the P-channel transistors are formed within an N-type well ("N-well") which is itself formed in the substrate. In a circuit cell, usually all of the P-channel transistors are formed within a single N-well extending across the entire upper half of the circuit cell, and if a P-well is used, all N-channel transistors are formed within a single P-well extending across the entire lower half of the circuit cell. Conventional filler cells also include the N-well across their entire upper half to thereby extend the well longitudinally along the entire row of cells. Where P-wells are used, P-wells also extend across the lower half of the filler cells for the same reason. The boundary of the N-well usually defines a straight line oriented longitudinally in the circuit cell.

Wells are typically fabricated by forming and patterning a resist above the substrate, and then implanting dopants into the regions not covered using a high energy implant process. It is well known that these dopants can scatter laterally off the resist sidewalls into active areas, thereby implanting extra dopant into transistor channel regions. The effect is known as the "well proximity effect." Transistors that are placed close to the edge of a well resist mask will therefore have an increased threshold voltage Vt.

Figure 8:
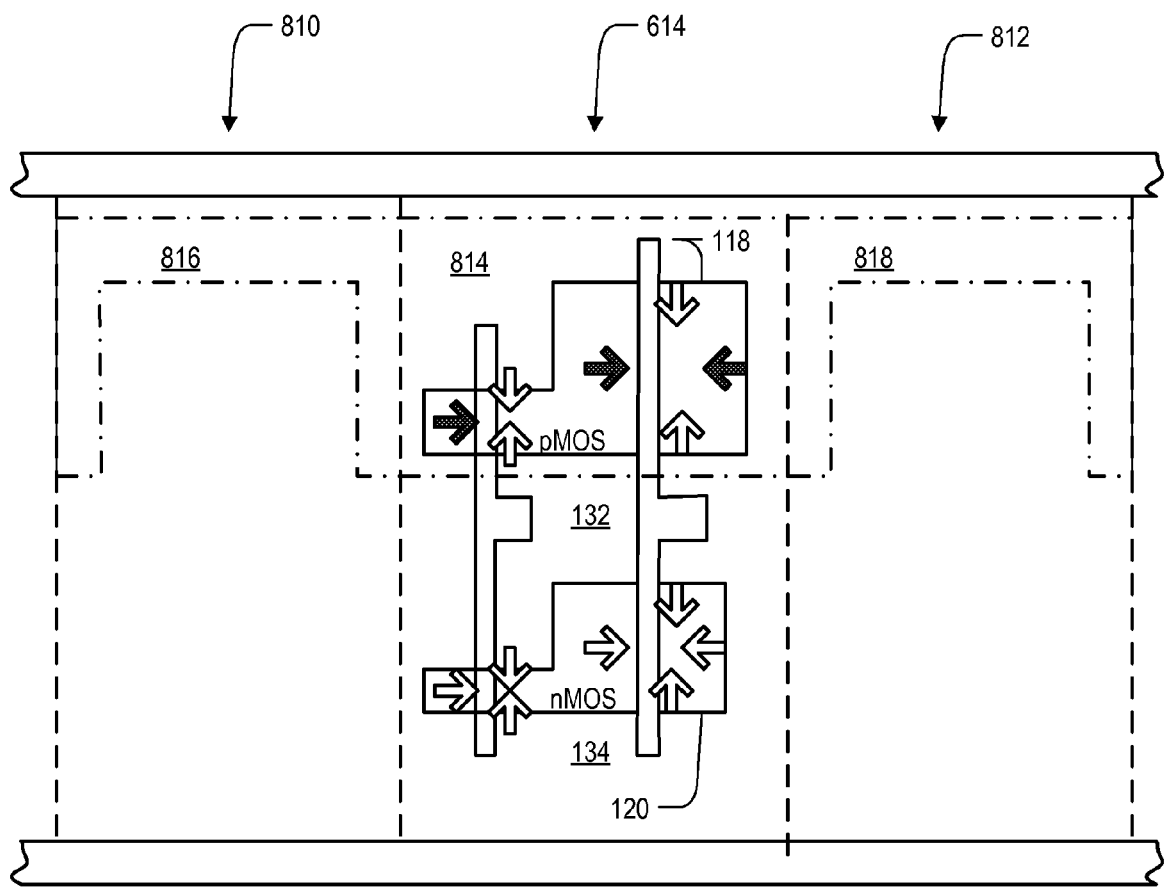

FIG. 8 illustrates how a filler cell design can be used to increase the Vt of certain transistors in a circuit cell in a controlled manner. FIG. 8 illustrates two filler cells 810 and 812 on opposite sides of the circuit cell 614 from FIG. 1. N-wells 814, 816 and 818 are shown respectively in circuit cell 614 and left- and right-adjacent filler cells 810 and 812, bounded symbolically by dot-dash lines. It can be seen that in the two filler cells, the N-well boundary has been shifted inward, thereby forming two N-well boundaries in close proximity to either side of the circuit cell 814, longitudinally aligned with the P-channel transistors. During fabrication, the N-wells 816 and 818 will be formed by applying a resist over the wafer and etching it away over the regions desired for the N-well implant. Because of the boundary shifts, this resist will include transversely oriented sidewalls in close proximity to either side of the circuit cell 814. During high energy implant, some of the N-well dopant will scatter off these walls and into the channel regions of nearby P-channel transistors in the adjacent circuit cell. These filler cell designs therefore will tend to increase the threshold voltage of nearby P-channel transistors in the circuit cell 614.

Figure 9:
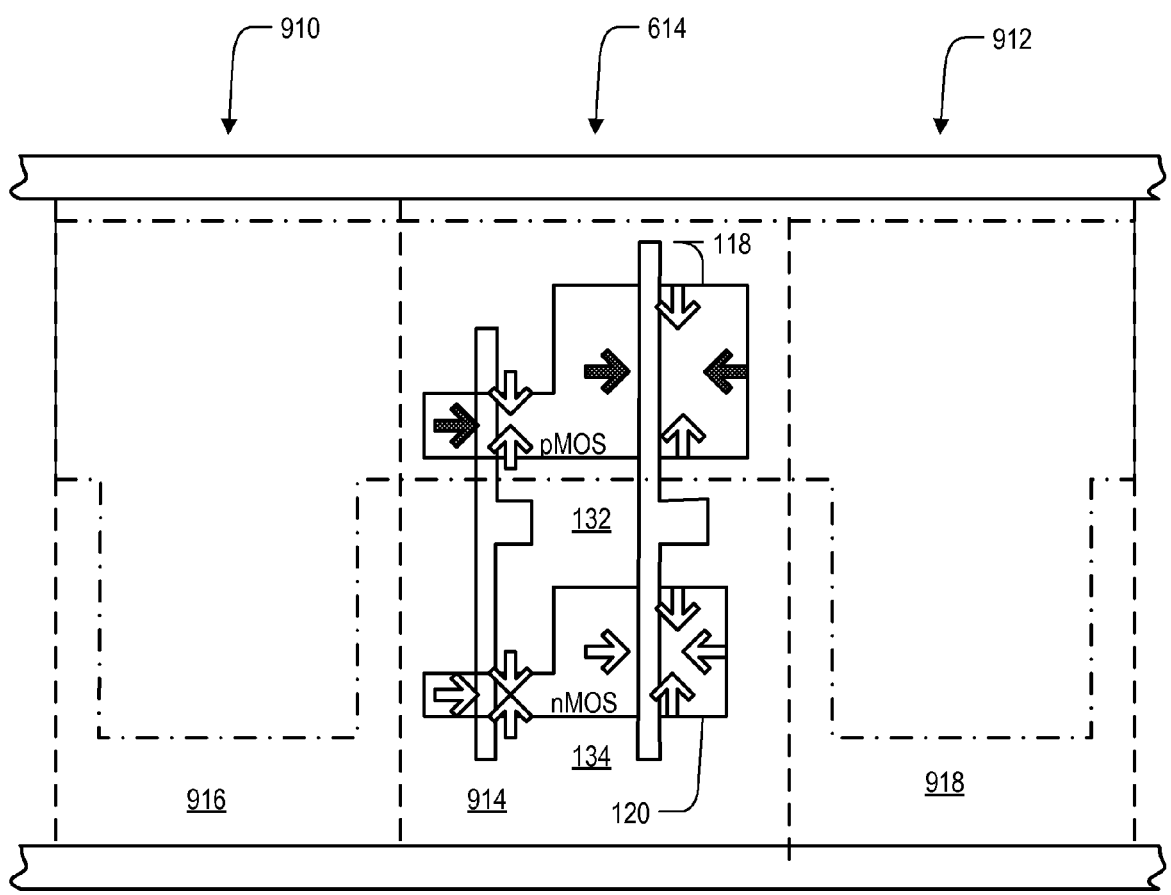

FIG. 9 illustrates another variation on the use of well boundaries, useful in a fabrication process that includes P-wells such as 914 (in circuit cell 614) and 916 and 918 (in the filler cells on both sides of the circuit cell 614). In FIG. 9, the boundary of the P-well in each of the filler cells has been shifted inward, thereby forming two P-well boundaries in close proximity to either side of the circuit cell 614, longitudinally aligned with the N-channel transistors. During fabrication, the P-wells 916 and 918 will be formed by applying a resist over the wafer and etching it away over the regions desired for the P-well implant. Because of the boundary shifts, this resist will include transversely oriented sidewalls in close proximity to both sides of the circuit cell 614. During high energy implant, some of the P-well dopant will scatter off these walls and into the channel regions of nearby N-channel transistors in the adjacent circuit cell 614. These filler cell designs therefore will tend to increase the threshold voltage of nearby N-channel transistors in the circuit cell.

Yet a fifth type of structure which can be included in filler cell designs to affect adjacent circuit cells, is an etch stop layer boundary shift. As mentioned above, after formation of the gate stacks in a fabrication process, a contact etch stop layer or cap layer is typically applied over the wafer. In some fabrication processes the etch stop layer includes a tensile strained cap layer over the N-channel transistors, whereas in other fabrication processes the etch stop layer includes a compressively strained cap layer over the P-channel transistors. In DSL (dual stress liner) fabrication processes, the etch stop layer includes both. In all three types of processes, the etch stop layer material(s) have a boundary, referred to herein as an etch stop layer boundary, typically half-way between the N-channel and P-channel diffusions.

Since the mask used to pattern the etch stop layer is typically the same as the mask used to pattern the N-well implant, the etch stop layer boundary is typically coincident with the N-well boundary. Therefore, since as previously mentioned, conventional filler cells include N-wells extending across the cell, the boundary of the etch stop layer, like the boundary of the N-well, usually also defines a straight line oriented longitudinally in the circuit cell. But as shown in FIGS. 8 and 9 and discussed above, this boundary can be shifted transversely in the filler cells. In the embodiment of FIG. 8, the boundary shift that reduces the size of the N-well within the filler cells also reduces the size of the compressively strained etch stop layer within the filler cells. This reduces the compressive longitudinal stress exerted on the channel regions of the P-channel transistors in the circuit cell 614. The filler cell design of FIG. 8 therefore will tend to reduce the transistor switching speeds and Ion's of nearby P-channel transistors in the circuit cell 614. Similarly, in the embodiment of FIG. 9, the boundary shift that reduces the size of the P-well within the filler cells also reduces the size of the tensile strained cap layer within the filler cells. This reduces the tensile longitudinal stress exerted on the channel regions of the N-channel transistors in the circuit cell 614. The filler cell design of FIG. 9 therefore will tend to reduce the transistor switching speeds and Ion's of nearby N-channel transistors in the circuit cell 614.

Note that for fabrication processes in which the mask used for N-well implants is different from the mask used for etch stop layer patterning, there is no reason why different filler cell designs cannot be made available in which the boundary shift (if any) in the etch stop layer differs from the boundary shift (if any) of the well implants. In this way, through proper choice of filler cells, the threshold voltages of transistors within the circuit cell can be adjusted independently from other performance parameters such as switching speed and Ion of transistors within the circuit cell.

Again, it will be appreciated that similarly to the diffusion, poly and contact structures described above, a variety of different filler cell designs can be made available for use in adjusting circuit cell performance parameters in a desired manner, with N-well boundaries and/or etch stop layer boundaries shifted either up or down, by varying amounts, and at varying distances from either the left or right boundary of the filler cell or both. Other variations described above for other structures can also be made available for filler cell designs having N-well and etch stop layer variations.

It can be seen that predefined filler cell designs can be provided using any or all of the above five types of structures as well as others, and using several variations for each. In one embodiment, predefined filler cell designs are provided separately for the particular mask layer or layers in which the respective structure will be implemented: diffusion mask for diffusion region structures, poly mask for poly structures, via mask for contact structures, and N-well mask for N-well boundary shifts, for example. The layout system is able to pick and choose whatever combination of selections, from each of the mask layers, that will yield the desired effect on the performance parameters of either the left-adjacent or the right-adjacent circuit cell or both. Preferably, however, the predefined filler cell designs each indicate a combination configuration for all the mask layers which are subject to variation in the cell. In either case, the predefined filler cell designs are organized into a database which is indexed according to the desired effect on a performance parameter of the left-adjacent circuit cell, the desired effect on a performance parameter of the right-adjacent circuit cell, width of the filler cell, and certain layout characteristics of the left- and right-adjacent circuit cells (such as the distance between a poly line or transistor diffusion region boundary to the edge of the circuit cell adjacent to the gap, and the transverse position and dimension of the nearest diffusion boundary). It can be seen that by providing predefined filler cell designs in a database, indexed in this manner, a layout enhancement system can employ very simple and therefore very quick rules for selecting a filler cell to insert in each gap under consideration.

As used herein, the term "database" does not necessarily imply any unity of structure. For example, two or more separate databases, when considered together, still constitute a "database" as that term is used herein. A database as described herein can be disposed in a computer memory, a hard disk drive, an optical drive, other storage media, or any other computer readable storage, and/or can be spread over more than one instance of computer readable storage. As used herein, the term "computer readable medium" refers to any one or more computer readable storage devices.

Inserting Filler Cells

Figure 10:
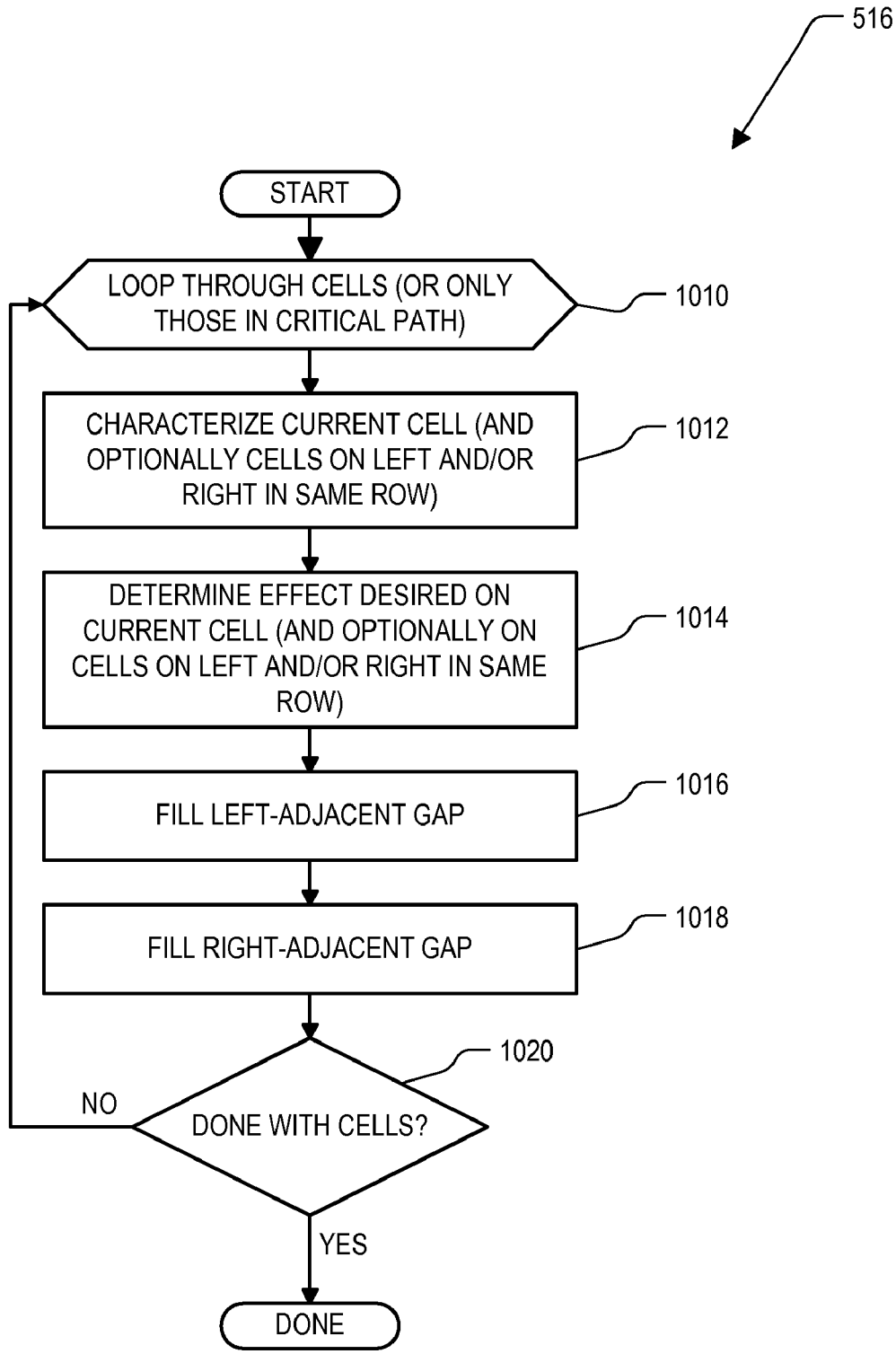

Returning to the methodology, FIG. 10 is a flow chart of an embodiment of step 516 (FIG. 5), for selecting and inserting filler cells. In step 1010, a loop begins through all the circuit cells to be enhanced through the use of effective filler cells. As mentioned, in various embodiments this can be all circuit cells in the layout, or only selected cells. In the embodiment of FIG. 10, only those circuit cells in a critical signal path are addressed.

In step 1012, any layout characteristics of the current circuit cell which are needed to select appropriate filler cell designs on the left and right, are determined. Similarly, if the left-adjacent circuit cell is also to be addressed, then any needed layout characteristics of that cell are determined, as well as any needed layout characteristics of the right-adjacent circuit cell if that cell is to be addressed as well.

In step 1014 it is determined what effect on performance parameters is desired for the current circuit cell (and optionally the left- and/or right-adjacent cells). As previously mentioned, usually it is desired to increase the switching speed and Ion of included transistors, but sometimes it is desired to decrease the values of these parameters. Also, in some cases it may be desirable to achieve different effects on P-channel vs. N-channel transistors. In some cases it might also be desirable to increase Vt to reduce leakage power.

In step 1016, the effects desired for, and the layout characteristics of, the current circuit cell and the left-adjacent circuit cell, are used to index into the database of filler cell designs to select a satisfactory design for the gap left-adjacent to the current circuit cell. The selected filler cell is then inserted into the left-adjacent gap. Similarly, In step 1018, the effects desired for, and the layout characteristics of, the current circuit cell and the right-adjacent circuit cell, are used to index into the database of filler cell designs to select a satisfactory design for the gap right-adjacent to the current circuit cell. The selected filler cell is then inserted into the right-adjacent gap.

In step 1020 it is determined whether all of the desired circuit cells have been addressed, and if not, the process returns to step 1010 for addressing the next circuit cell. Otherwise, if all desired circuit cells have been addressed, then the process of step 516 ends.

Figure 11:
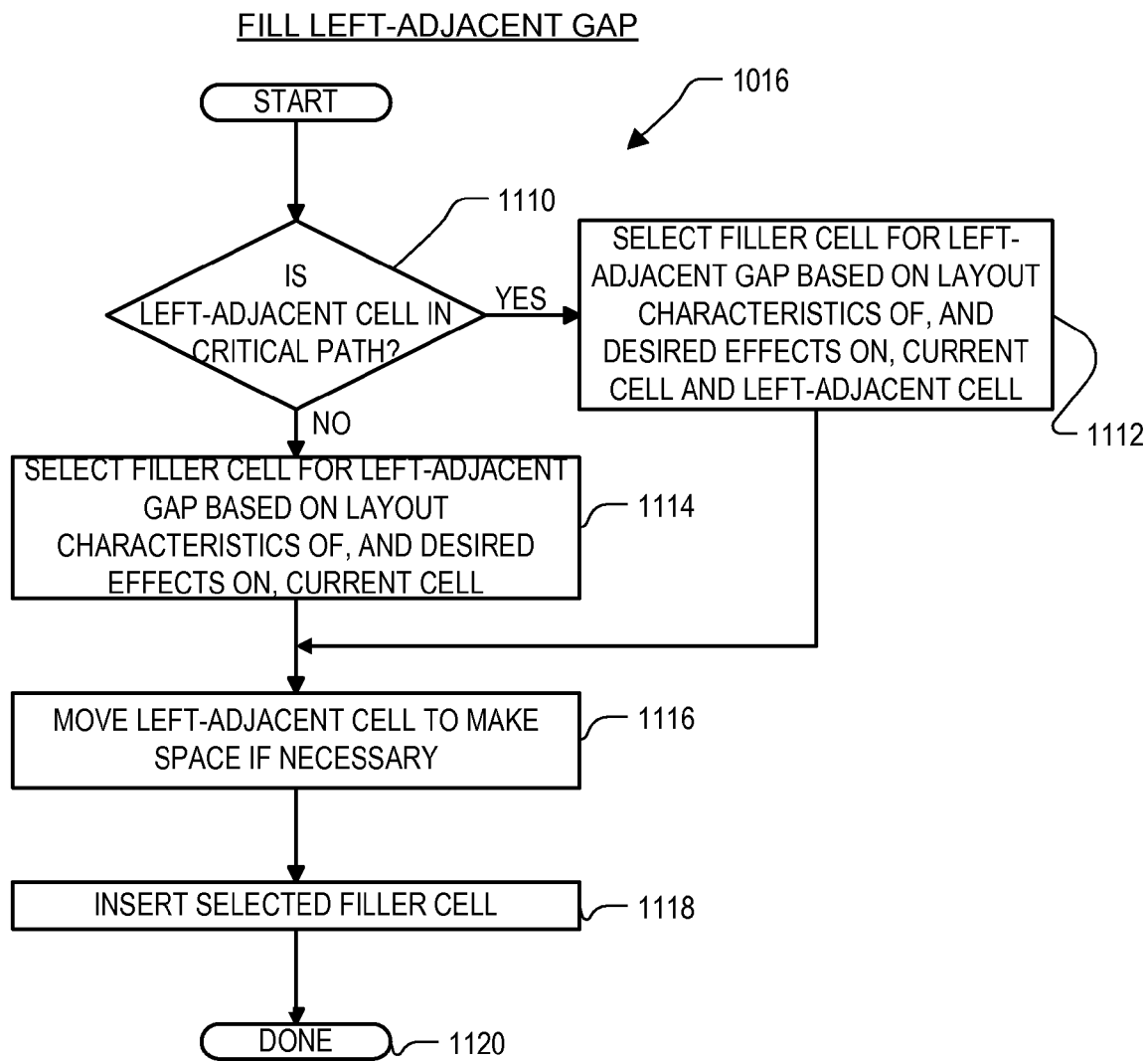

FIG. 11 is a flow chart of an embodiment of step 1016 for filling the left-adjacent gap. In step 1110, it is first determined whether the left-adjacent circuit cell is in a critical path. If so, then in step 1112, a filler cell design is selected for the left-adjacent gap based on the layout characteristics of, and desired effects on, both the current circuit cell and the left-adjacent circuit cell. If not, then in step 1114, a filler cell design is selected for the left-adjacent gap based on the layout characteristics of, and desired effects on, only the current circuit cell. In either case, in the "active" embodiment, in step 1116 the left-adjacent cell is moved if necessary to allow sufficient space for the selected filler cell. As mentioned, in one active embodiment the movement is limited to shifting the circuit cell within its current row. In another embodiment the circuit cell can be moved to an adjacent or non-adjacent row. In either case, an embodiment might also permit other cells (other than the left-adjacent circuit cell) to be moved in order to make sufficient space for the selected filler cell. In step 1118, the selected filler cell is inserted in the gap left-adjacent to the current cell, in contact with the current cell. Step 1016 concludes with step 1120.

Figure 12:
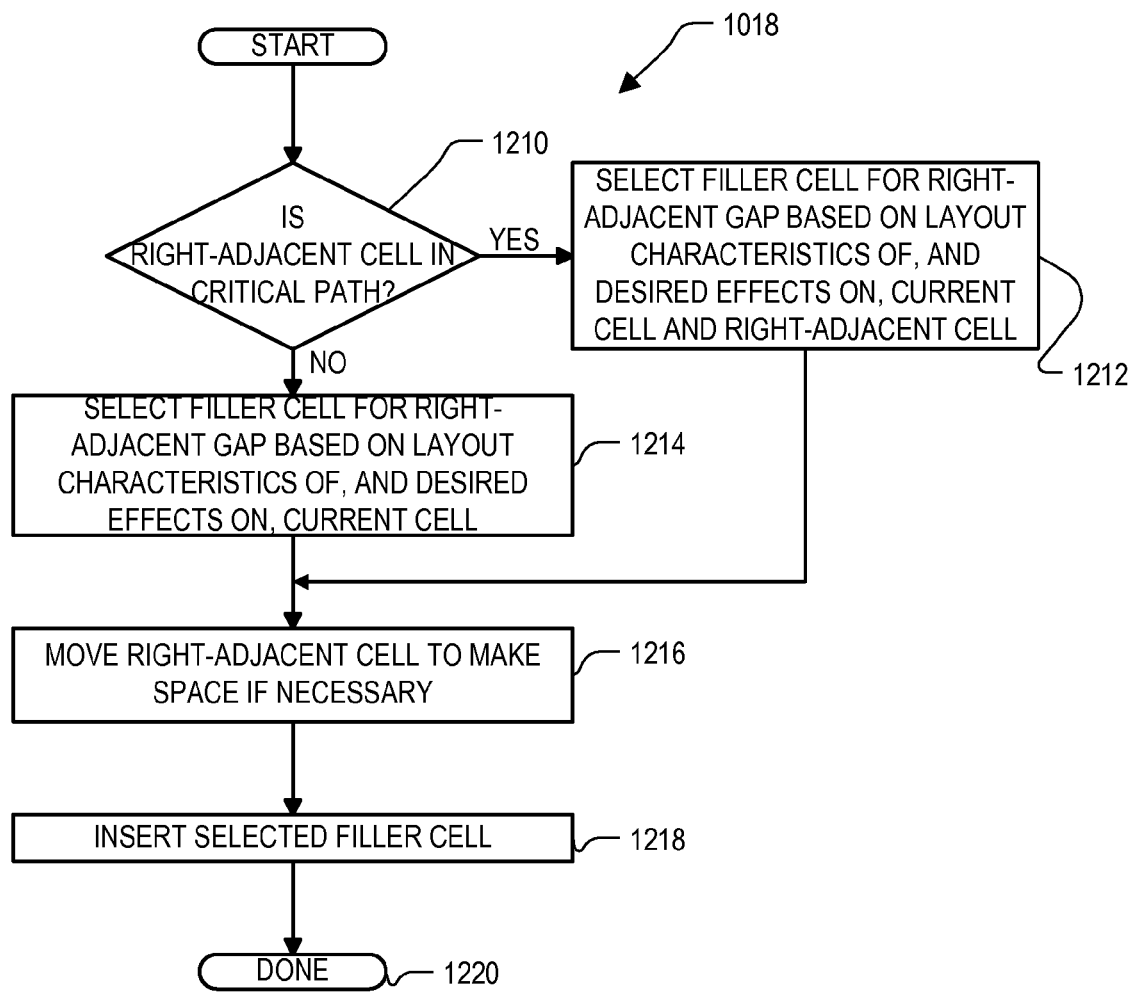

FIG. 12 is a flow chart of an embodiment of step 1018 for filling the right-adjacent gap. As for step 1016, in step 1210, it is first determined whether the right-adjacent circuit cell is in a critical path. If so, then in step 1212, a filler cell design is selected for the right-adjacent gap based on the layout characteristics of, and desired effects on, both the current circuit cell and the right-adjacent circuit cell. If not, then in step 1214, a filler cell design is selected for the right-adjacent gap based on the layout characteristics of, and desired effects on, only the current circuit cell. In either case, in the "active" embodiment, in step 1216 the right-adjacent cell is moved if necessary to allow sufficient space for the selected filler cell. In step 1218, the selected filler cell is inserted in the gap right-adjacent to the current cell, in contact with the current cell. Step 1018 concludes with step 1220.

The descriptions herein of the stress impact on transistors and of the methods to use stress to improve transistor performance apply to what are presently the standard crystallographic orientations used in the semiconductor industry, with the (100) wafer surface and <110> channel direction. The stress distribution changes only slightly for alternative possible crystal orientations of the wafer and the transistor channel, but the impact of stress on carrier mobility can change significantly not only in magnitude, but also in sign. Therefore, the described methodologies can be still applied to an arbitrary crystal orientation of the wafer and the transistors, but the type and location of the structures in filler cells will need to be adjusted for each specific case. The same is true for alternative semiconductors like germanium and compound semiconductors like GaAs, InP, SiC.

At this point it should be noted that the introduction of selected filler cells into a layout can be beneficial even where circuit cell performance is not altered, because a benefit can be obtained merely by removing or reducing the sensitivity that circuit cell performance otherwise has to its positions and surroundings in a particular layout. For example, if a minor change in the circuit design causes a particular transistor to be positioned differently in the resulting layout, and if the stress effects then cause the transistor's Ion value to depend on its position and its neighborhood in the layout, then the minor change in the circuit design might produce unintended results after the layout step. This can require the designer to revisit upstream steps in the EDA process of FIG. 4 to correct the unintended consequences. The corrections then applied in the circuit design might again produce unintended consequences after layout, requiring the designer to change the circuit design yet again, and so on. A stress modification step that reduces the sensitivity of circuit cell performance to its position in the layout, therefore, can be beneficial by helping to isolate the circuit design step from the layout step, thereby reducing the need to revisit upstream EDA steps. Accordingly, in another embodiment, decision step 520 in FIG. 5 can be replaced by a decision step asking whether the stress-modified layout removes a layout-induced variation in circuit cell performance, and whether any increases in other factors of the cost function outweigh this benefit.

The removal of layout sensitivity is beneficial especially in the context of standard cells, because layout-dependent stress can cause timing variations from instance to instance of the same cell depending on the cell placement and its neighborhood. A premise of standard cell design is that optimally the same cell design and layout can be used and re-used, wherever desired and without adjustments made internally to account for the context of its use. Some or all of the above techniques can therefore be used in standard cell layouts in order to isolate the cell from external stress influences. In particular, for example, filler cells with dummy diffusions can inserted into both gaps on either side of a circuit cell to reduce stress interaction of internal transistors from outside stress sources.

Figure 13:
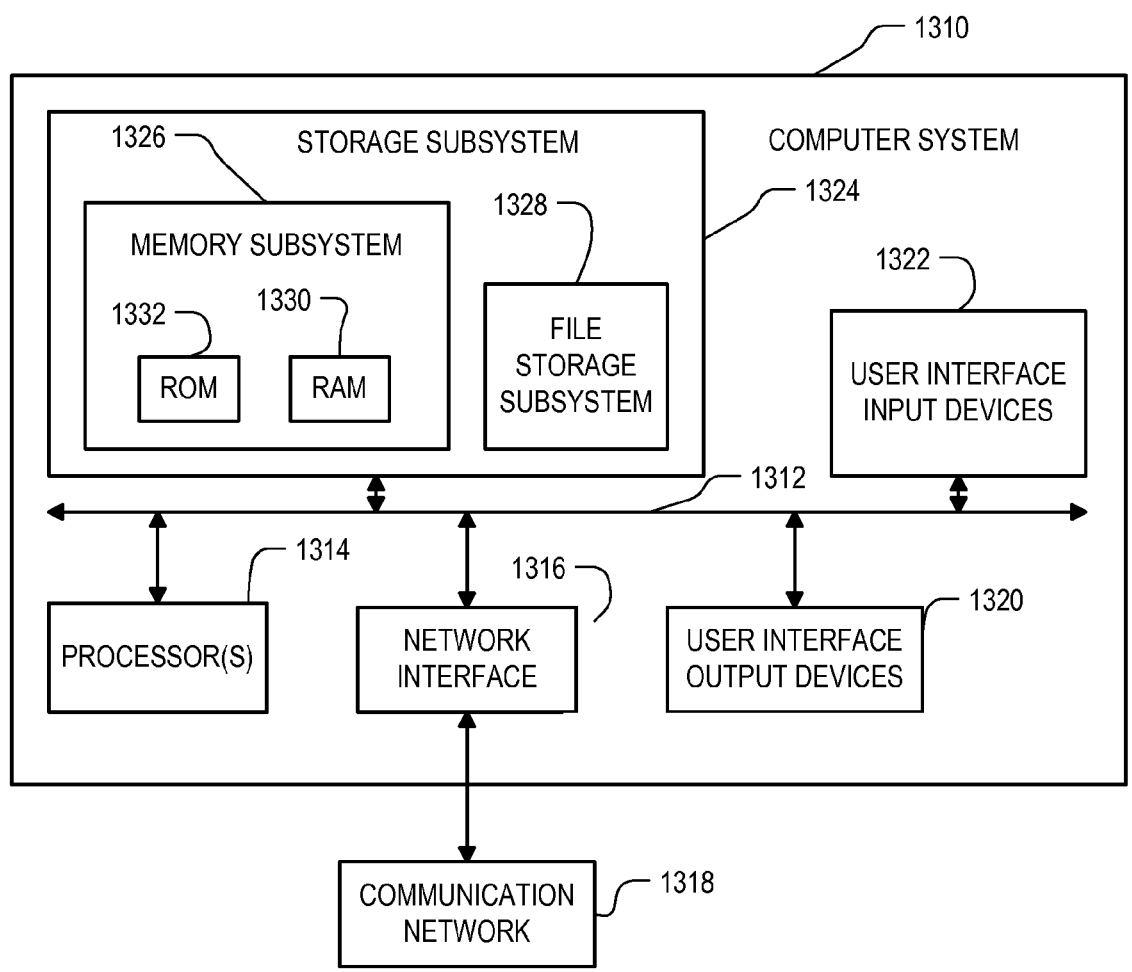
FIG. 13 is a simplified block diagram of a computer system suitable for performing various steps shown in FIGS. 4, 5, 10, 11 and 12.

FIG. 13 is a simplified block diagram of a computer system 1310 suitable for performing various steps shown in FIGS. 4 and 5. In one embodiment a single computer system is used for performing all the steps, whereas in another embodiment different computer systems are used for various different ones of the steps. Computer system 1310 typically includes at least one processor 1314 which communicates with a number of peripheral devices via bus subsystem 1312. These peripheral devices may include a storage subsystem 1324, comprising a memory subsystem 1326 and a file storage subsystem 1328, user interface input devices 1322, user interface output devices 1320, and a network interface subsystem 1316. The input and output devices allow user interaction with computer system 1310. Network interface subsystem 1316 provides an interface to outside networks, including an interface to communication network 1318, and is coupled via communication network 1318 to corresponding interface devices in other computer systems. Communication network 1318 may comprise many interconnected computer systems and communication links. These communication links may be wireline links, optical links, wireless links, or any other mechanisms for communication of information. While in one embodiment, communication network 1318 is the Internet, in other embodiments, communication network 1318 may be any suitable computer network.

User interface input devices 1322 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1310 or onto computer network 1318.

User interface output devices 1320 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1310 to the user or to another machine or computer system.

Storage subsystem 1324 stores the basic programming and data constructs that provide the functionality of certain embodiments of the present invention. For example, the various modules implementing the functionality of certain embodiments of the invention may be stored in storage subsystem 1324. These software modules, when executed by processor 1314, perform computer-implemented steps of FIGS. 4 and 5.

Memory subsystem 1326 typically includes a number of memories including a main random access memory (RAM) 1330 for storage of instructions and data during program execution and a read only memory (ROM) 1332 in which fixed instructions are stored. File storage subsystem 1328 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may be stored by file storage subsystem 1328.

Bus subsystem 1312 provides a mechanism for letting the various components and subsystems of computer system 1310 communicate with each other as intended. Although bus subsystem 1312 is shown schematically as a single bus, alternative embodiments of the bus subsystem may use multiple busses.

Computer system 1310 itself can be of varying types including a personal computer, a portable computer, a workstation, a computer terminal, a network computer, a television, a mainframe, or any other data processing system or user device. Due to the ever-changing nature of computers and networks, the description of computer system 1310 depicted in FIG. 13 is intended only as a specific example for purposes of illustrating certain embodiments of the present invention. Many other configurations of computer system 1310 are possible having more or less components than the computer system depicted in FIG. 13.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for laying out an integrated circuit design, for use with a database defining a plurality of filler cell designs, the layout being for use in fabricating an integrated circuit device according to the design, comprising the steps of:
   providing to a computer system a first layout of the integrated circuit design, the first layout defining a plurality of masks, the masks defining a plurality of integrated circuit features when applied in a fabrication process, the features defining a plurality of circuit layout cells having gaps therebetween; and
   the computer system inserting into each given gap in at least a subset of the gaps, a corresponding filler cell selected from the database in dependence upon a desired effect on a performance parameter of at least one circuit cell adjacent to the given gap.

2. A method according to claim 1, wherein in the first layout, the plurality of circuit layout cells are arranged in rows, each of the gaps being disposed in one of the rows between a corresponding pair of the circuit cells in the same row,
   and wherein the step of inserting a corresponding filler cell into each given gap, comprises the step of selecting the corresponding filler cell in dependence upon effects desired on a performance parameter of both circuit cells adjacent to the given gap.

3. A method according to claim 1, wherein the performance parameter is a member of the group consisting of transistor electron mobility, Ion, switching speed, signal path delay, leakage, and power.

4. A method according to claim 1, wherein the desired effect is to improve the performance parameter.

5. A method according to claim 1, wherein the desired effect is to reduce the sensitivity of the performance parameter to a circuit layout cell's layout neighborhood.

6. A method according to claim 1, wherein the step of inserting a corresponding filler cell comprises the step of inserting a first filler cell in a gap adjacent to a subject circuit layout cell, the first filler cell including a dummy diffusion region longitudinally aligned with a diffusion region of an N-channel transistor in the subject circuit layout cell.

7. A method according to claim 1, wherein the fabricating of the integrated circuit device includes a step of applying an etch stop layer over gate stack layers of the integrated circuit device,
   wherein the step of inserting a corresponding filler cell comprises the step of inserting a first filler cell in a gap adjacent to a subject circuit layout cell, the first filler cell including a transversely oriented dummy polysilicon line.

8. A method according to claim 1, wherein the step of inserting a corresponding filler cell comprises the step of inserting a first filler cell in a gap adjacent to a subject circuit layout cell, the first filler cell including a dummy contact region.

9. A method according to claim 1, wherein a subject circuit layout cell includes an N-well formed below P-channel transistors and not below N-channel transistors, the N-well having a longitudinally oriented well boundary,
   and wherein the step of inserting a corresponding filler cell comprises the step of inserting a first filler cell in a gap adjacent to the subject circuit layout cell, the first filler cell including an N-well boundary, at least a portion of which being not in-line with the N-well boundary of the N-well in the subject circuit layout cell.

10. A method according to claim 1, wherein the fabricating of the integrated circuit device includes a step of applying an etch stop layer over gate stack layers of the integrated circuit device, the etch stop layer having a longitudinally oriented boundary, and wherein the step of inserting a corresponding filler cell comprises the step of inserting a first filler cell in a gap adjacent to a subject circuit layout cell, the first filler cell including an etch stop layer boundary, at least a portion of which being not in-line with the etch stop layer boundary in the subject circuit layout cell.

11. A method according to claim 1, wherein the desired effect on a performance parameter includes improving transistor electron mobility in a CMOS circuit in a subject circuit layout cell, and wherein the step of inserting a corresponding filler cell comprises the step of inserting a first filler cell in a gap adjacent to a subject circuit layout cell, the first filler cell including a dummy diffusion region longitudinally aligned with the diffusion region of an N-channel transistor in the subject circuit layout cell, the first filler cell lacking any diffusion region longitudinally aligned with the diffusion region of any P-channel transistor in the subject circuit layout cell.

12. A method according to claim 1, wherein the desired effect on the performance parameter derives at least in part from stress effects.

13. A method according to claim 1, wherein the desired effect on the performance parameter derives at least in part from optical proximity effects.

14. A method according to claim 1, wherein the desired effect on the performance parameter derives at least in part from the well proximity effect.

15. A method according to claim 1, further comprising the step of moving the position of a particular one of the circuit layout cells in order to make space for one of the corresponding filler cells.

16. A method according to claim 15, wherein the step of moving comprises the step of moving the position of the particular circuit layout cell in a manner that retains topological equivalence.

17. A method according to claim 15, wherein in the first layout, the plurality of circuit layout cells are arranged in rows, and wherein the step of moving the position of the particular circuit layout cell, comprises the step of shifting the particular layout cell within the same row and without losing topological equivalence.

18. A method according to claim 15, wherein in the first layout, the plurality of circuit layout cells are arranged in rows, and wherein the step of moving the position of the particular circuit layout cell, comprises the step of moving the particular layout cell into an adjacent row of layout cells.

19. A system for laying out an integrated circuit design, for use with a database defining a plurality of filler cell designs, the layout being for use in fabricating an integrated circuit device according to the design, comprising:

means for providing a first layout of the integrated circuit design, the first layout defining a plurality of masks, the masks defining a plurality of integrated circuit features when applied in a fabrication process, the features defining a plurality of circuit layout cells having gaps therebetween; and means for inserting into each given gap in at least a subset of the gaps, a corresponding filler cell selected from the database in dependence upon a desired effect on a performance parameter of at least one circuit cell adjacent to the given gap.

20. A system according to claim 19, wherein in the first layout, the plurality of circuit layout cells are arranged in rows, each of the gaps being disposed in one of the rows between a corresponding pair of the circuit cells in the same row, and wherein the means for inserting a corresponding filler cell into each given gap, comprises means for selecting the corresponding filler cell in dependence upon effects desired on a performance parameter of both circuit cells adjacent to the given gap.

21. A system according to claim 19, further comprising means for moving the position of a particular one of the circuit layout cells in order to make space for one of the corresponding filler cells.

22. A system according to claim 21, wherein the means for moving comprises means for moving the position of the particular circuit layout cell in a manner that retains topological equivalence.

23. A system according to claim 21, wherein in the first layout, the plurality of circuit layout cells are arranged in rows, and wherein the means for moving the position of the particular circuit layout cell, comprises means for shifting the particular layout cell within the same row and without losing topological equivalence.

24. A system according to claim 21, wherein in the first layout, the plurality of circuit layout cells are arranged in rows, and wherein the means for moving the position of the particular circuit layout cell, comprises means for moving the particular layout cell into an adjacent row of layout cells.

25. A system according to claim 19, wherein the means for inserting a corresponding filler cell comprises means for inserting a first filler cell in a gap adjacent to a subject circuit layout cell, the first filler cell including a dummy diffusion region longitudinally aligned with a diffusion region of an N-channel transistor in the subject circuit layout cell.

26. A system according to claim 19, wherein the fabricating of the integrated circuit device includes applying an etch stop layer over gate stack layers of the integrated circuit device, wherein the means for inserting a corresponding filler cell comprises means for inserting a first filler cell in a gap adjacent to a subject circuit layout cell, the first filler cell including a transversely oriented dummy polysilicon line.

27. A system according to claim 19, wherein the means for inserting a corresponding filler cell comprises the step of inserting a first filler cell in a gap adjacent to a subject circuit layout cell, the first filler cell including a dummy contact region.

28. A system according to claim 19, wherein a subject circuit layout cell includes an N-well formed below P-channel transistors and not below N-channel transistors, the N-well having a longitudinally oriented well boundary, and wherein the means for inserting a corresponding filler cell comprises means for inserting a first filler cell in a gap adjacent to the subject circuit layout cell, the first filler cell including an N-well boundary, at least a portion of which being not in-line with the N-well boundary of the N-well in the subject circuit layout cell.

29. A system according to claim 19, wherein the fabricating of the integrated circuit device includes applying an etch stop layer over gate stack layers of the integrated circuit device, the etch stop layer having a longitudinally oriented boundary, and wherein the means for inserting a corresponding filler cell comprises means for inserting a first filler cell in a gap adjacent to a subject circuit layout cell, the first filler cell including an etch stop layer boundary, at least a portion of which being not in-line with the etch stop layer boundary in the subject circuit layout cell.

30. A system according to claim 19, wherein the desired effect on a performance parameter includes improving transistor electron mobility in a CMOS circuit in a subject circuit layout cell,
and wherein the means for inserting a corresponding filler cell comprises means for inserting a first filler cell in a gap adjacent to a subject circuit layout cell, the first filler cell including a dummy diffusion region longitudinally aligned with the diffusion region of an N-channel transistor in the subject circuit layout cell, the first filler cell lacking any diffusion region longitudinally aligned with the diffusion region of any P-channel transistor in the subject circuit layout cell.

31. A system according to claim 19, wherein the desired effect on the performance parameter derives at least in part from stress effects.

32. A system according to claim 19, wherein the desired effect on the performance parameter derives at least in part from optical proximity effects.

33. A system according to claim 19, wherein the desired effect on the performance parameter derives at least in part from the well proximity effect.

34. A method according to any of claims 1, 3, 6-11 and 15, further comprising the step of the computer system storing accessibly to the computer system a revised layout including at least one of the inserted filler cells.

* * * * *